United States Patent
Duan et al.

(10) Patent No.: US 12,429,521 B2
(45) Date of Patent: Sep. 30, 2025

(54) JTAG STANDARD PIN TEST SYSTEM

(71) Applicants: SQ Technology (Shanghai) Corporation, Shanghai (CN); Inventec Corporation, Taipei (TW)

(72) Inventors: Qiu-Yue Duan, Shanghai (CN); Xin-Ying Xie, Shanghai (CN); Lin Zhang, Shanghai (CN)

(73) Assignees: SQ Technology (Shanghai) Corporation, Shanghai (CN); Inventec Corporation, Taipei (TW)

( * ) Notice: Subject to any disclaimer, the term of this patent is extended or adjusted under 35 U.S.C. 154(b) by 0 days.

(21) Appl. No.: 18/592,227

(22) Filed: Feb. 29, 2024

(65) Prior Publication Data
US 2025/0189581 A1 Jun. 12, 2025

(30) Foreign Application Priority Data
Dec. 7, 2023 (CN) .......................... 202311675216.3

(51) Int. Cl.
*G01R 31/3185* (2006.01)
(52) U.S. Cl.
CPC ............................ *G01R 31/318572* (2013.01)
(58) Field of Classification Search
CPC ............................................. G01R 31/318572
See application file for complete search history.

(56) References Cited

U.S. PATENT DOCUMENTS

| | | | | |
|---|---|---|---|---|
| 5,852,617 A * | 12/1998 | Mote, Jr. | ............... | G06F 11/221 714/E11.161 |
| 6,539,510 B1 * | 3/2003 | St. Pierre, Jr. | . | G01R 31/318536 714/25 |
| 12,025,660 B2 * | 7/2024 | Duan | ............. | G01R 31/318533 |
| 2011/0204910 A1 * | 8/2011 | Suto | .................... | G01R 31/2815 29/829 |
| 2017/0184668 A1 * | 6/2017 | Song | ...................... | G06F 11/273 |
| 2021/0013648 A1 * | 1/2021 | Spencer | ............... | G01R 1/0416 |

OTHER PUBLICATIONS

H. Ehrenberg, "PXI Express Based JTAG / Boundary Scan ATE for Structural Board and System Test," 2006 IEEE Autotestcon, Anaheim, CA, USA, 2006, pp. 467-473, doi: 10.1109/AUTEST.2006. 283708. (Year: 2006).*
C. Clark, D. Dubberke, K. P. Parker and B. Tuthill, "Solutions for undetected shorts on IEEE 1149.1 self-monitoring pins," 2010 IEEE International Test Conference, Austin, TX, USA, 2010, pp. 1-8, (Year: 2010).*

* cited by examiner

*Primary Examiner* — Cynthia Britt

(57) ABSTRACT

A boundary-scan standard pin test system is disclosed. In the system, to-be-tested slots are electrically connected to form different to-be-tested series chains, or riser cards which are inserted into the to-be-tested slots are electrically connected to each other through first boundary-scan input interfaces and first boundary-scan output interfaces thereof or through second boundary-scan input interfaces and second boundary-scan output interfaces thereof, to form different riser-card series chains; a TAP controller provides a boundary-scan format test signal to a to-be-tested series chain or a riser-card series chain to make a test card perform a boundary-scan standard pin test, so as to achieve the technical effect of efficiency of providing the boundary-scan standard pin test for the to-be-tested slots on different to-be-tested boards by a testing machine.

9 Claims, 7 Drawing Sheets

JTAG STANDARD PIN TEST SYSTEM

BACKGROUND OF THE INVENTION

1. Field of the Invention

The present invention is related to a test system, more particularly to a boundary-scan standard pin test system.

2. Description of the Related Art

The conventional testing method for to-be-tested slots on a to-be-tested board involves inserting test cards into the to-be-tested slots respectively and then interconnecting the test cards to each other to perform a boundary-scan standard pin test.

However, the conventional testing method is only suitable for testing to-be-tested slots on the same to-be-tested board. In other words, the quantity, configuration, and positions of to-be-tested slots on different test boards are different, and the number of the used test cards and the configuration of interconnecting test cards are also different, each other. Therefore, it is unable to use the same testing machine to test to-be-tested slots on different to-be-tested boards.

According to above-mentioned contents, what is needed is to develop an improved solution to solve the problem that the conventional testing machine is only able to perform the boundary-scan standard pin test on the to-be-tested slots of the same to-be-tested board.

SUMMARY OF THE INVENTION

An objective of the present invention is to provide a boundary-scan standard pin test system, to solve the problem that the conventional testing machine only can perform the boundary-scan standard pin test on the to-be-tested slots of the same to-be-tested board.

In order to achieve the objective, the present invention disclose a first embodiment of a boundary-scan standard pin test system, the boundary-scan standard pin test system includes a to-be-tested board, riser cards, test cards, a TAP controller and a test data generating device.

The to-be-tested board has to-be-tested slots, wherein the to-be-tested slots are electrically connected to form different to-be-tested series chains. Each of the riser cards has a riser card insertion interface, a riser-card edge-connector interface, a first boundary-scan input interface, a first boundary-scan output interface, a second boundary-scan input interface, and a second boundary-scan output interface, wherein test data input (TDI) pins of the riser card insertion interface, the riser-card edge-connector interface, the first boundary-scan input interface, the first boundary-scan output interface, the second boundary-scan input interface, and the second boundary-scan output interface are electrically connected to each other, and test data output (TDO) pins of the riser card insertion interface, the riser-card edge-connector interface, the first boundary-scan input interface, the first boundary-scan output interface, the second boundary-scan input interface, and the second boundary-scan output interface are electrically connected to each other, test clock (TCK) pins of the riser card insertion interface, the riser-card edge-connector interface, the first boundary-scan input interface, the first boundary-scan output interface, the second boundary-scan input interface, and the second boundary-scan output interface are electrically connected to each other, test mode select (TMS) pins of the riser card insertion interface, the riser-card edge-connector interface, the first boundary-scan input interface, the first boundary-scan output interface, the second boundary-scan input interface, and the second boundary-scan output interface are electrically connected to each other, and test reset (TRST) pins of the riser card insertion interface, the riser-card edge-connector interface, the first boundary-scan input interface, the first boundary-scan output interface, the second boundary-scan input interface, and the second boundary-scan output interface are electrically connected to each other.

The riser-card edge-connector interface of each of the riser cards is inserted into a corresponding one of the to-be-tested slots, so that the inserted riser-card edge-connector interface is electrically connected to TDI pins, the TDO pins, the TCK pins, the TMS pins, and the TRST pins of the corresponding one of the to-be-tested slots.

Each of the test cards has a boundary scan component, a boundary-scan input interface, a boundary-scan output interface, and an edge connector interface, wherein TDI pins of the boundary scan component, the boundary-scan input interface, the boundary-scan output interface, and the edge connector interface are electrically connected to each other, TDO pins of the boundary scan component, the boundary-scan input interface, the boundary-scan output interface, and the edge connector interface are electrically connected to each other, TCK pins of the boundary scan component, the boundary-scan input interface, the boundary-scan output interface, and the edge connector interface are electrically connected to each other, TMS pins of the boundary scan component, the boundary-scan input interface, the boundary-scan output interface, and the edge connector interface are electrically connected to each other, and TRST pins of the boundary scan component, the boundary-scan input interface, the boundary-scan output interface, and the edge connector interface are electrically connected to each other.

The edge connector interface of each of the test cards is inserted into the riser card insertion interface of a corresponding one of the riser cards, so that the inserted edge connector interface is electrically connected to the TDI pins, the TDO pins, the TCK pins, the TMS pins, and the TRST pins of the riser card insertion interface of the corresponding one of the riser cards. Each of the test cards performs a boundary-scan standard pin test on a boundary-scan format test signal provided from the corresponding one of the to-be-tested slots and outputs a boundary-scan format test result signal.

The test access port (TAP) controller is electrically connected to different to-be-tested series chains, and configured to convert test data into corresponding boundary-scan format test signals and provide the boundary-scan format test signals to the different to-be-tested series chains, respectively, receives the boundary-scan format test result signals from the to-be-tested series chains, and converts the received boundary-scan format test result signals into response data.

The test data generating device is electrically connected to the TAP controller, and configured to provide the test data to the TAP controller, and receive the response data corresponding to the to-be-tested slots from the TAP controller.

In order to achieve the objective, the present invention discloses a second embodiment of a boundary-scan standard pin test system, the boundary-scan standard pin test system includes a to-be-tested board, riser cards, test cards, a TAP controller and a test data generating device.

The to-be-tested board has to-be-tested slots.

Each of the riser cards includes a riser card insertion interface, a riser-card edge-connector interface, a first boundary-scan input interface, a first boundary-scan output interface, a second boundary-scan input interface, and a second boundary-scan output interface, TDI pins of the riser card insertion interface, the riser-card edge-connector interface, the first boundary-scan input interface, the first boundary-scan output interface, the second boundary-scan input interface, and the second boundary-scan output interface are electrically connected to each other, TDO pins of the riser card insertion interface, the riser-card edge-connector interface, the first boundary-scan input interface, the first boundary-scan output interface, the second boundary-scan input interface, and the second boundary-scan output interface are electrically connected to each other, TCK pins of the riser card insertion interface, the riser-card edge-connector interface, the first boundary-scan input interface, the first boundary-scan output interface, the second boundary-scan input interface, and the second boundary-scan output interface are electrically connected to each other, TMS pins of the riser card insertion interface, the riser-card edge-connector interface, the first boundary-scan input interface, the first boundary-scan output interface, the second boundary-scan input interface, and the second boundary-scan output interface are electrically connected to each other, and TRST pins of the riser card insertion interface, the riser-card edge-connector interface, the first boundary-scan input interface, the first boundary-scan output interface, the second boundary-scan input interface, and the second boundary-scan output interface are electrically connected to each other.

The riser-card edge-connector interface of each of the riser cards is inserted into the riser card insertion interface of a corresponding one of the to-be-tested slots, so that the riser-card edge-connector interface of each of the riser cards is electrically connected to the TDI pins, the TDO pins, the TCK pins, the TMS pins, and the TRST pins of the riser card insertion interface of the corresponding one of the to-be-tested slots.

Each of the test cards has a boundary scan component, a boundary-scan input interface, a boundary-scan output interface, and an edge connector interface, wherein TDI pins of the boundary scan component, the boundary-scan input interface, the boundary-scan output interface, and the edge connector interface are electrically connected to each other, TDO pins of the boundary scan component, the boundary-scan input interface, the boundary-scan output interface, and the edge connector interface are electrically connected to each other, TCK pins of the boundary scan component, the boundary-scan input interface, the boundary-scan output interface, and the edge connector interface are electrically connected to each other, TMS pins of the boundary scan component, the boundary-scan input interface, the boundary-scan output interface, and the edge connector interface are electrically connected to each other, and TRST pins of the boundary scan component, the boundary-scan input interface, the boundary-scan output interface, and the edge connector interface are electrically connected to each other.

The edge connector interface of each of the test cards is inserted into the riser card insertion interface of a corresponding one of the riser cards, so that the inserted edge connector interface is electrically connected to the TDI pins, the TDO pins, the TCK pins, the TMS pins, and the TRST pins of the riser card insertion interface of the corresponding one of the riser cards. Each of the test cards performs a boundary-scan standard pin test on a boundary-scan format test signal provided from the corresponding one of the to-be-tested slots and outputs a boundary-scan format test result signal.

The TAP controller is electrically connected to different riser-card series chains, and configured to convert test data into the boundary-scan format test signals and provide the boundary-scan format test signals to the riser-card series chains, receive the boundary-scan format test result signals from the riser-card series chains, convert the received boundary-scan format test result signals into response data.

The test data generating device is electrically connected to the TAP controller, configured to provide the test data to the TAP controller, and receive the response data corresponding to the to-be-tested slots from the TAP controller.

According to the above-mentioned system of the present invention, the to-be-tested slots are electrically connected to form different to-be-tested series chains, or the riser cards are electrically connected to each other through the first boundary-scan input interfaces and the first boundary-scan output interfaces thereof or through the second boundary-scan input interfaces and the second boundary-scan output interfaces thereof, to form different riser-card series chains; the TAP controller provides the boundary-scan format test signal to the to-be-tested series chain or the riser-card series chain to make the test card perform the boundary-scan standard pin test.

Therefore, the above-mentioned technical solution of the present invention is able to achieve the technical effect of efficiency of providing the boundary-scan standard pin test for the to-be-tested slots on different to-be-tested boards by a testing machine.

BRIEF DESCRIPTION OF THE DRAWINGS

The structure, operating principle and effects of the present invention will be described in detail by way of various embodiments which are illustrated in the accompanying drawings.

DETAILED DESCRIPTION OF THE PREFERRED EMBODIMENTS

Figure 1:
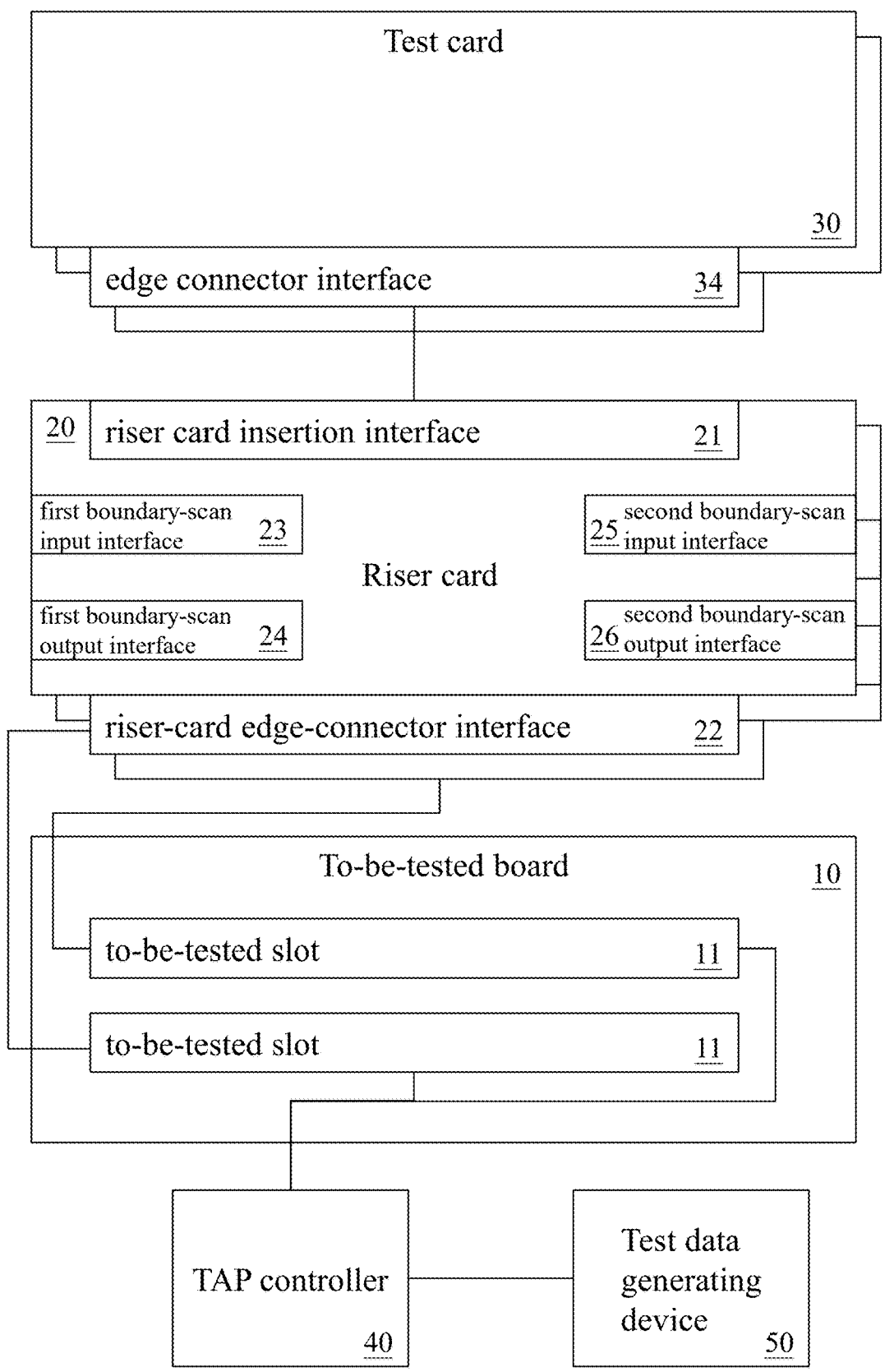
FIG. 1 is a system block diagram of a boundary-scan standard pin test, according to a first embodiment of the present invention.

The following embodiments of the present invention are herein described in detail with reference to the accompanying drawings. These drawings show specific examples of the embodiments of the present invention. These embodiments are provided so that this disclosure will be thorough and complete, and will fully convey the scope of the invention to those skilled in the art. It is to be acknowledged that these embodiments are exemplary implementations and are not to be construed as limiting the scope of the present invention in any way. Further modifications to the disclosed embodiments, as well as other embodiments, are also included within the scope of the appended claims.

These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts. As used herein, the singular forms "a", "an" and "the" are intended to include the plural forms as well, unless the context clearly indicates otherwise.

It is to be acknowledged that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be acknowledged that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the words "comprise" and "include", and variations such as "comprises", "comprising", "includes", or "including", will be acknowledged to imply the inclusion of stated elements but not the exclusion of any other elements.

A first embodiment of a boundary-scan standard pin test system of the present invention will be illustrated in the following paragraphs. Please refer to FIG. 1. FIG. 1 is a system block diagram of the first embodiment of the boundary-scan standard pin test system, according to the present invention.

As shown in FIG. 1, the first embodiment of the boundary-scan standard pin test system includes a to-be-tested board 10, riser cards 20, test cards 30, a TAP controller 40 and a test data generating device 50.

The to-be-tested board 10 includes to-be-tested slots 11, and the to-be-tested slots 11 can be electrically connected to each other selectively to form different to-be-tested series chains. Particularly, the to-be-tested board 10 can include a first to-be-tested slot, a second to-be-tested slot, a third to-be-tested slot and a fourth to-be-tested slot, the first to-be-tested slot and the second to-be-tested slot can be electrically connected to each other to form a first to-be-tested series chain, the third to-be-tested slot and the fourth to-be-tested slot can be electrically connected to form a second to-be-tested series chain; alternatively, the first to-be-tested slot and the third to-be-tested slot can be electrically connected to form a first to-be-tested series chain, the second to-be-tested slot and the fourth to-be-tested slot can be electrically connected to form a second to-be-tested series chain; however, these examples are merely for exemplary illustration, and the application field of the present invention is not limited to these examples.

Figure 2:
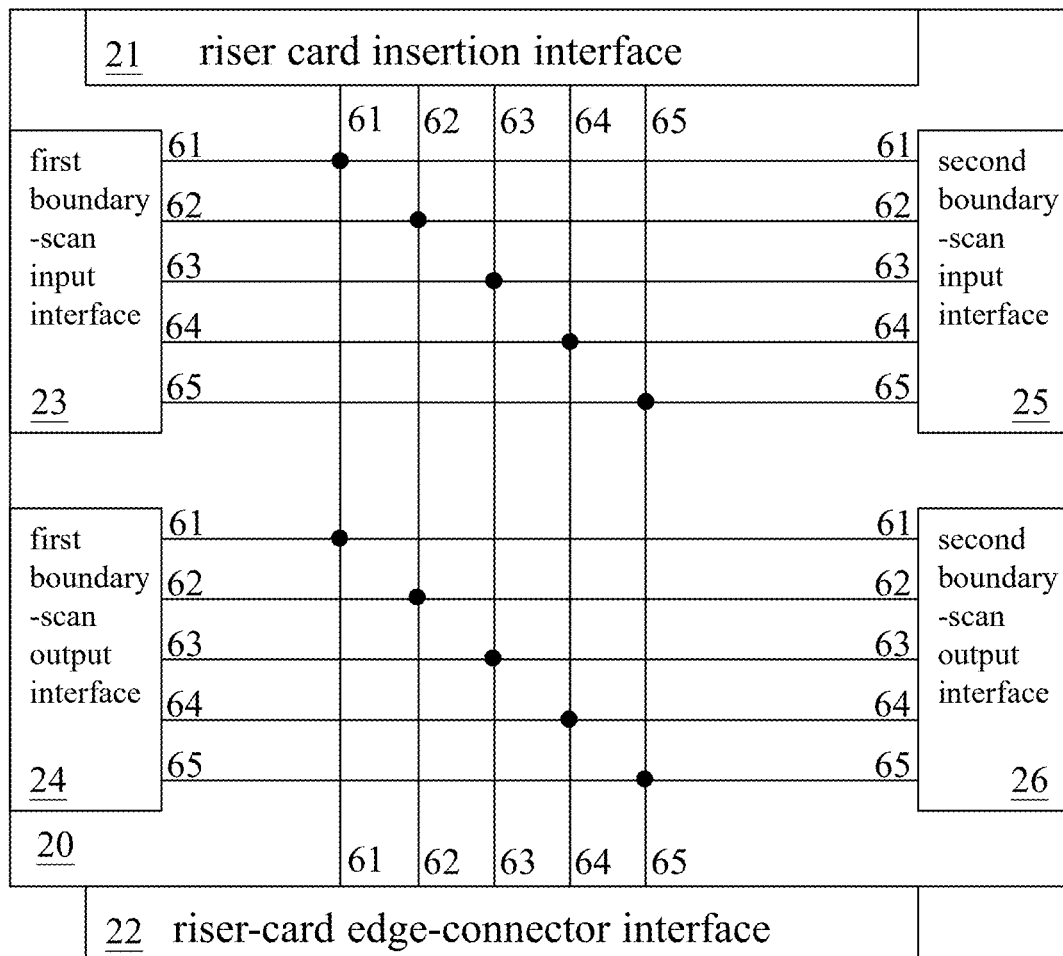
FIG. 2 is a block diagram of a riser card of a boundary-scan standard pin test, according to a first embodiment of the present invention.

Please refer to FIG. 2. FIG. 2 is a block diagram of a riser card of the first embodiment of the boundary-scan standard pin test, according to the present invention. Each riser card 20 can include a riser card insertion interface 21, a riser-card edge-connector interface 22, a first boundary-scan input interface 23, a first boundary-scan output interface 24, a second boundary-scan input interface 25 and a second boundary-scan output interface 26. Test data input (TDI) pins 61 of the riser card insertion interface 21, the riser-card edge-connector interface 22, the first boundary-scan input interface 23, the first boundary-scan output interface 24, the second boundary-scan input interface 25 and the second boundary-scan output interface 26 are electrically connected to each other. Test data output (TDO) pins 62 of the riser card insertion interface 21, the riser-card edge-connector interface 22, the first boundary-scan input interface 23, the first boundary-scan output interface 24, the second boundary-scan input interface 25 and the second boundary-scan output interface 26 are electrically connected to each other. Test clock pin (TCK) 63 of the riser card insertion interface 21, the riser-card edge-connector interface 22, the first boundary-scan input interface 23, the first boundary-scan output interface 24, the second boundary-scan input interface 25 and the second boundary-scan output interface 26 are electrically connected to each other. Test mode select (TMS) pins 64 of the riser card insertion interface 21, the riser-card edge-connector interface 22, the first boundary-scan input interface 23, the first boundary-scan output interface 24, the second boundary-scan input interface 25 and the second boundary-scan output interface 26 are electrically connected to each other. Test reset pin (TRST) 65 of the riser card insertion interface 21, the riser-card edge-connector interface 22, the first boundary-scan input interface 23, the first boundary-scan output interface 24, the second boundary-scan input interface 25 and the second boundary-scan output interface 26 are electrically connected to each other.

The riser-card edge-connector interface 22 of riser cards 20 is inserted into a corresponding one of the to-be-tested slots 11, so that the inserted riser-card edge-connector interface 22 is electrically connected to the TDI pin 61, the TDO pin 62, the TCK pin 63, the TMS pin 64 and the TRST pin 65 of the corresponding one of the to-be-tested slots 11.

As mentioned above, the first riser card is inserted into the first to-be-tested slot, the second riser card is inserted into the second to-be-tested slot, the third riser card is inserted into the third to-be-tested slot, the fourth riser card is inserted into the fourth to-be-tested slot; that is, the riser-card edge-connector interface of the first riser card is electrically connected to the TDI pin, the TDO pin, the TCK pin, the TMS pin, and the TRST pin of the first to-be-tested slot, respectively. The riser-card edge-connector interface of the second riser card is electrically connected to the TDI pin, the TDO pin, the TCK pin, the TMS pin, and the TRST pin of the second to-be-tested slot, respectively, and so forth, so the detailed description of another connection is not repeated herein.

Figure 3:
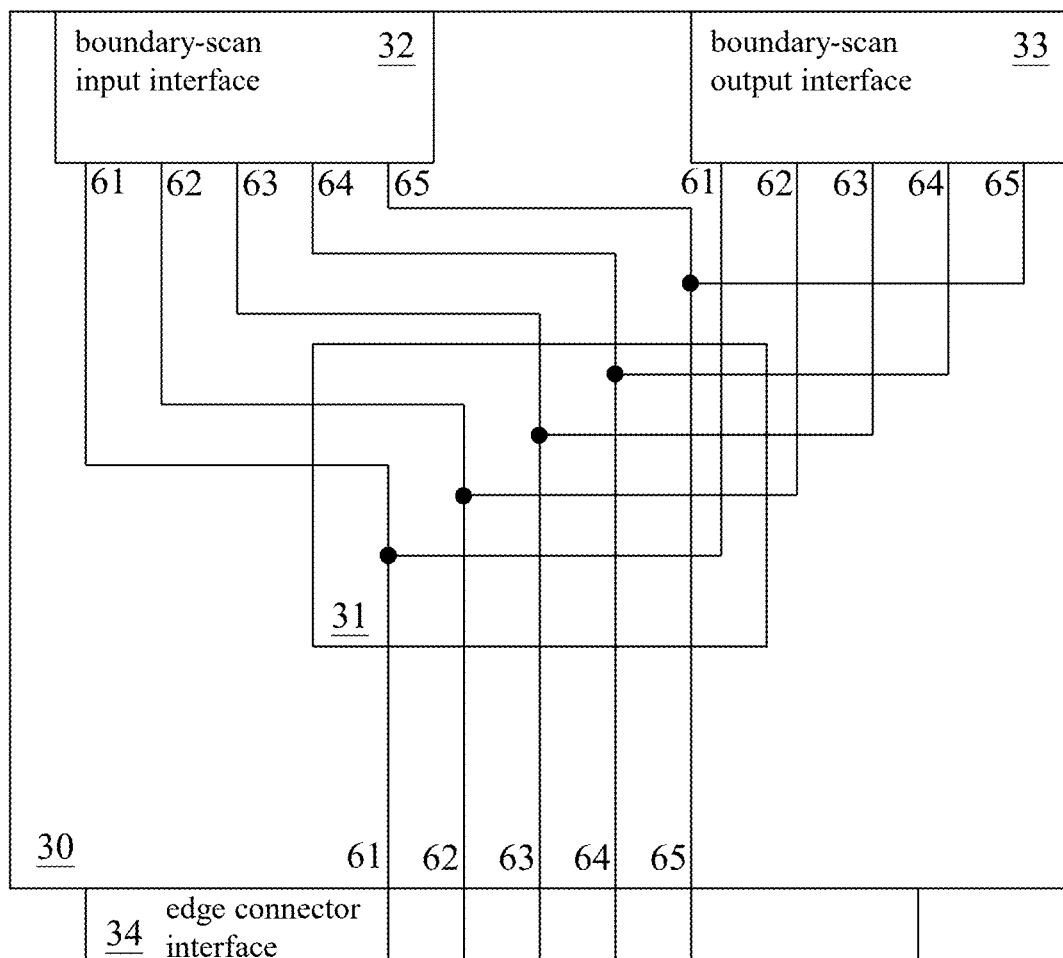
FIG. 3 is a block diagram of a test card of a boundary-scan standard pin test, according to a first embodiment of the present invention.

Please refer to FIG. 3. FIG. 3 is a block diagram of a test card of the first embodiment of boundary-scan standard pin test, according to the present invention. Each test card 30 includes a boundary scan component 31, a boundary-scan input interface 32, a boundary-scan output interface 33 and an edge connector interface 34. TDI pins 61 of the boundary scan component 31, the boundary-scan input interface 32, the boundary-scan output interface 33 and the edge connector interface 34 are electrically connected to each other, TDO pins 62 of the boundary scan component 31, the boundary-scan input interface 32, the boundary-scan output interface 33 and the edge connector interface 34 are electrically connected to each other, TCK pins 63 of the boundary scan component 31, the boundary-scan input interface 32, the boundary-scan output interface 33 and the edge connector interface 34 are electrically connected to each other, TMS pins 64 of the boundary scan component 31, the boundary-scan input interface 32, the boundary-scan output interface 33 and the edge connector interface 34 are electrically connected to each other, and TRST pins 65 of the boundary scan component 31, the boundary-scan input interface 32, the boundary-scan output interface 33 and the edge connector interface 34 are electrically connected to each other.

The edge connector interface 34 of each test card is inserted into the riser card insertion interface 21 of a corresponding one of the riser cards 20, so that the edge connector interface 34 is electrically connected to the TDI pin 61, the TDO pin 62, the TCK pin 63, the TMS pin 64, and the TRST pin 65 of the corresponding one of the riser card insertion interfaces 21, respectively.

As mentioned above, the first test card is inserted into the first riser card, the second test card is inserted into the second riser card, the third test card is inserted into the third riser card, the fourth test card is inserted into the fourth riser card; that is, the edge connector interface of the first test card is electrically connected to the TDI pin, the TDO pin, the TCK pin, the TMS pin and the TRST pin of the riser card insertion interface of the first riser card, respectively. The edge connector interface of the second test card is electrically connected to the TDI pin, the TDO pin, the TCK pin, the TMS pin and the TRST pin of the riser card insertion interface of the second riser card, respectively, and so forth, so the detailed description of other connection is not repeated herein.

The test data generating device 50 is electrically connected to the TAP controller 40, and the test data generating device 50 provides the test data to the TAP controller 40. The TAP controller 40 is electrically connected to different to-be-tested series chains, respectively, and configured to convert different test data into the boundary-scan format test signals and provide each of the boundary-scan format test signals to a corresponding one of the to-be-tested series chains.

The test card 30 performs a boundary-scan standard pin test on the boundary-scan format test signal provided from the to-be-tested slot 11 and outputs a boundary-scan format test result signal, the TAP controller 40 receives the boundary-scan format test result signal from the to-be-tested series chain and converts the received boundary-scan format test result signal into response data. The test data generating device 50 receives the response data corresponding to the to-be-tested slot from the TAP controller 40, so that entire testing process is completed.

It should be noted that, in actual test process, when the first to-be-tested slot and the third to-be-tested slot are electrically connected to each to form a first to-be-tested series chain, the second to-be-tested slot and the fourth to-be-tested slot can be electrically connected to form a second to-be-tested series chain, the user can only insert the first riser card into the first to-be-tested slot and insert the third riser card into the third to-be-tested slot, and insert the first test card into the first riser card, and insert the third test card into the third riser card.

The test data generating device 50 can provide only test data corresponding to the first to-be-tested series chain to the TAP controller 40, the TAP controller 40 converts the test data into the boundary-scan format test signal corresponding to the first to-be-tested series chain, provide the boundary-scan format test signal to the first to-be-tested series chain, so that the first test card and the third test card can perform the boundary-scan standard pin test and output the boundary-scan format test result signal; however, these examples are merely for exemplary illustration, and the application field of the present invention is not limited to these examples.

In an embodiment, the user can only insert the second riser card into the second to-be-tested slot, the fourth riser card into the fourth to-be-tested slot, and insert the second test card into the second riser card, and the fourth test card into the fourth riser card, and the test data generating device 50 provides only test data corresponding to the second to-be-tested series chain to the TAP controller 40, the TAP controller 40 converts the test data into the boundary-scan format test signal corresponding to the second to-be-tested series chain, provide the boundary-scan format test signal to the second to-be-tested series chain, so that the second test card and the fourth test card can perform the boundary-scan standard pin test and output the boundary-scan format test result signal; however, these examples are merely for exemplary illustration, and the application field of the present invention is not limited to these examples.

In an embodiment, the first riser card can be inserted into the first to-be-tested slot, the second riser card can be inserted into the second to-be-tested slot, the third riser card can be inserted into the third to-be-tested slot, and the fourth riser card can be inserted into the fourth to-be-tested slot, and the first test card is inserted into the first riser card, the second test card is inserted into the second riser card, the third test card is inserted into the third riser card, and the fourth test card is inserted into the fourth riser card, the test data generating device 50 can provide only test data corresponding to the first to-be-tested series chain or the second to-be-tested series chain, to the TAP controller 40, the TAP controller 40 converts the test data into the boundary-scan format test signal corresponding to the first to-be-tested series chain or the second to-be-tested series chain, provide the boundary-scan format test signal to the first to-be-tested series chain or the second to-be-tested series chain, so that the first test card and the third test card or the second test card and the fourth test card can perform the boundary-scan standard pin test and output the boundary-scan format test result signal; however, these examples are merely for exemplary illustration, and the application field of the present invention is not limited to these examples.

A second embodiment of a boundary-scan standard pin test system of the present invention will be illustrated in the following paragraphs. Please refer to FIG. 4, FIG. 4 is a system block diagram of a boundary-scan standard pin test of a second embodiment, according to the present invention.

Figure 4:
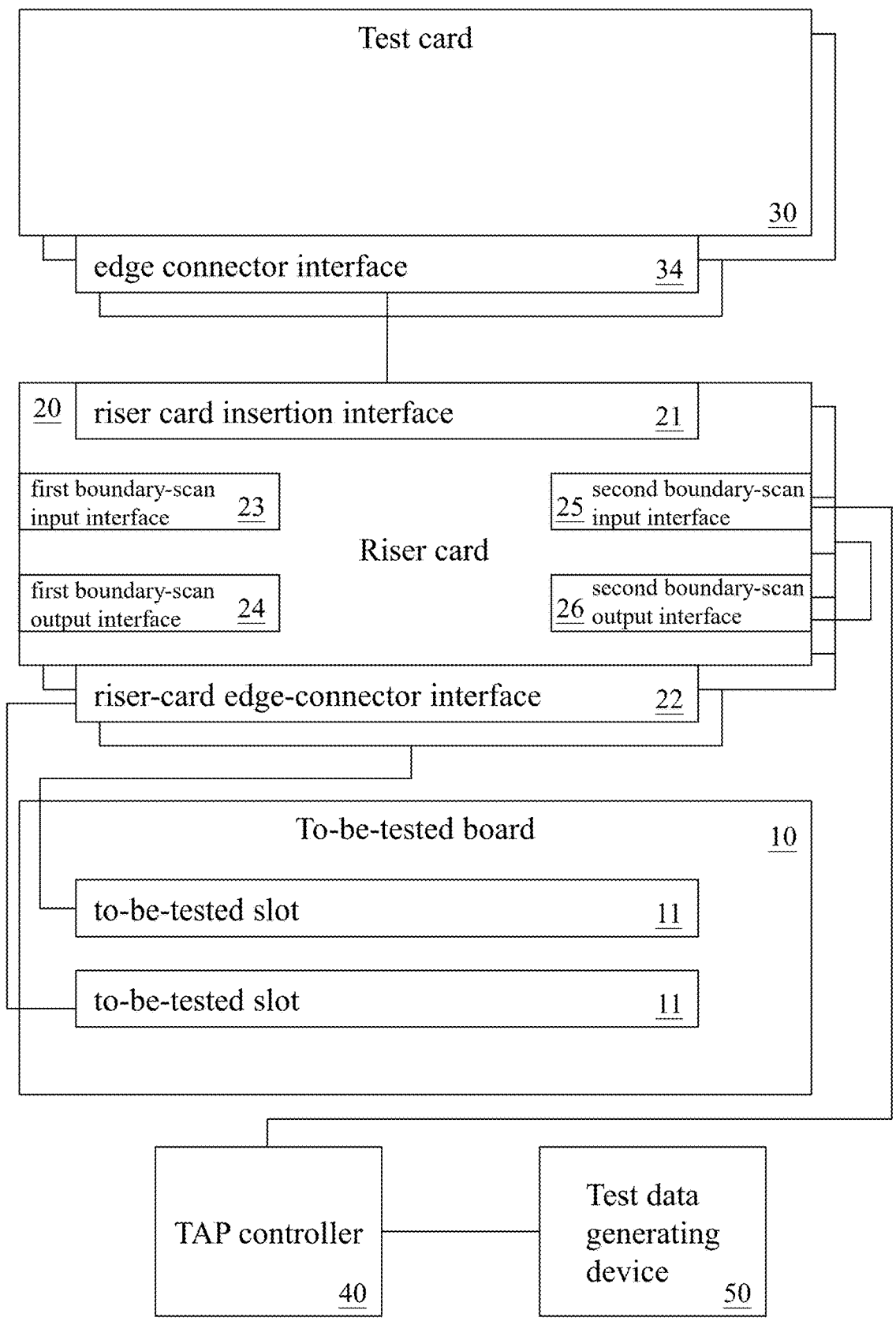
FIG. 4 is a system block diagram of a boundary-scan standard pin test, according to a second embodiment of the present invention.

As shown in FIG. 4, the second embodiment of the boundary-scan standard pin test system includes a to-be-tested board 10, riser cards 20, test cards 30, a TAP controller 40 and a test data generating device 50. Each to-be-tested board 10 include to-be-tested slots 11.

Figure 5:
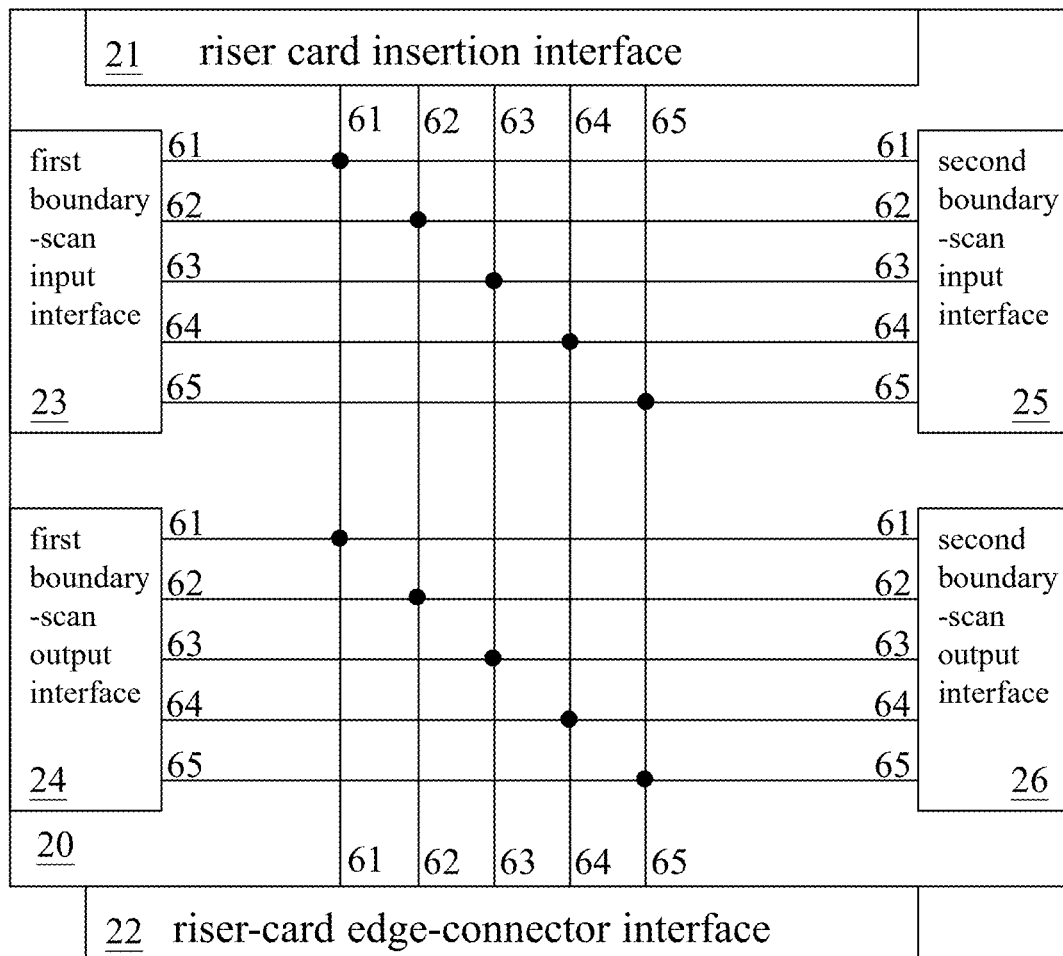
FIG. 5 is a block diagram of a riser card of a boundary-scan standard pin test, according to a second embodiment the present invention.

Please refer to FIG. 5. FIG. 5 is a block diagram of a riser card of a boundary-scan standard pin test of a second embodiment, according to the present invention. As shown in FIG. 5, each the riser card 20 includes a riser card insertion interface 21, a riser-card edge-connector interface 22, a first boundary-scan input interface 23, a first boundary-scan output interface 24, a second boundary-scan input interface 25 and a second boundary-scan output interface 26. TDI pins 61 of the riser card insertion interface 21, the riser-card edge-connector interface 22, the first boundary-scan input interface 23, the first boundary-scan output interface 24, the second boundary-scan input interface 25, and the second boundary-scan input interface 26 are electrically connected to each other, TDO pin 62 of the riser card insertion interface 21, the riser-card edge-connector interface 22, the first boundary-scan input interface 23, the first boundary-scan output interface 24, the second boundary-scan input interface 25, and the second boundary-scan input interface 26 are electrically connected to each other. TCK pins 63 of the riser card insertion interface 21, the riser-card edge-connector interface 22, the first boundary-scan input interface 23, the first boundary-scan output interface 24, the second boundary-scan input interface 25, and the second boundary-scan input interface 26 are electrically connected to each other. TMS pins 64 of the riser card insertion interface 21, the riser-card edge-connector interface 22, the first boundary-scan input interface 23, the first boundary-scan output interface 24, the second boundary-scan input interface 25, and the second boundary-scan input interface 26 are electrically connected to each other. TRST pin 65 of the riser card insertion interface 21, the riser-card edge-connector interface 22, the first boundary-scan input interface 23, the first boundary-scan output interface 24, the second boundary-scan input interface 25, and the second boundary-scan input interface 26 are electrically connected to each other.

The riser-card edge-connector interface 22 of each riser card 20 is inserted into a corresponding one of the to-be-tested slots 11, so that the riser-card edge-connector interface 22 is electrically connected to the TDI pin 61, the TDO pin 62, the TCK pin 63, the TMS pin 64, and the TRST pin 65 of the corresponding one of the to-be-tested slot 11. The riser cards 20 are electrically connected to each other through the first boundary-scan input interfaces 23 and the first boundary-scan output interfaces 24 thereof or the second boundary-scan input interfaces 25 and the second boundary-scan output interfaces 26 thereof, to form different riser-card series chains.

The first riser card is inserted into the first to-be-tested slot, the second riser card is inserted into the second to-be-tested slot, the third riser card is inserted into the third to-be-tested slot, the fourth riser card is inserted into the fourth to-be-tested slot; that is, the riser-card edge-connector interface of the first riser card is electrically connected to the TDI pin, the TDO pin, the TCK pin, the TMS pin, and the TRST pin of the first to-be-tested slot, the riser-card edge-connector interface of the second riser card is electrically connected to the TDI pin, the TDO pin, the TCK pin, the TMS pin, and the TRST pin of the second to-be-tested slot, and so forth, so the detailed description of another connection is not repeated herein.

The first boundary-scan output interface of the first riser card is electrically connected to the first boundary-scan input interface of the second riser card to form a first riser-card series chain, the first boundary-scan output interface of the third riser card is electrically connected to the first boundary-scan input interface of the fourth riser card to form a second riser-card series chain. Alternatively, the first boundary-scan output interface of the first riser card is electrically connected to the first boundary-scan input interface of the second riser card to form a first riser-card series chain, and the second boundary-scan output interface of the third riser card is electrically connected to the second boundary-scan input interface of the fourth riser card to form a second riser-card series chain. Alternatively, the first boundary-scan output interface of the first riser card is electrically connected to the first boundary-scan input interface of the third riser card to form a first riser-card series chain, and the first boundary-scan output interface of the second riser card is electrically connected to the first boundary-scan input interface of the fourth riser card to form a second riser-card series chain. Alternatively, the first boundary-scan output interface of the first riser card is electrically connected to the first boundary-scan input interface of the third riser card to form a first riser-card series chain, the second boundary-scan output interface of the second riser card is electrically connected to the second boundary-scan input interface of the fourth riser card to form a second riser-card series chain. The above-mentioned riser-card series chains are merely for exemplary illustration, and another combination manner to form riser-card series chain can be deduced in the same way, so detailed description is not repeated therein, and the application field of the present invention is not limited to these examples.

Figure 6:
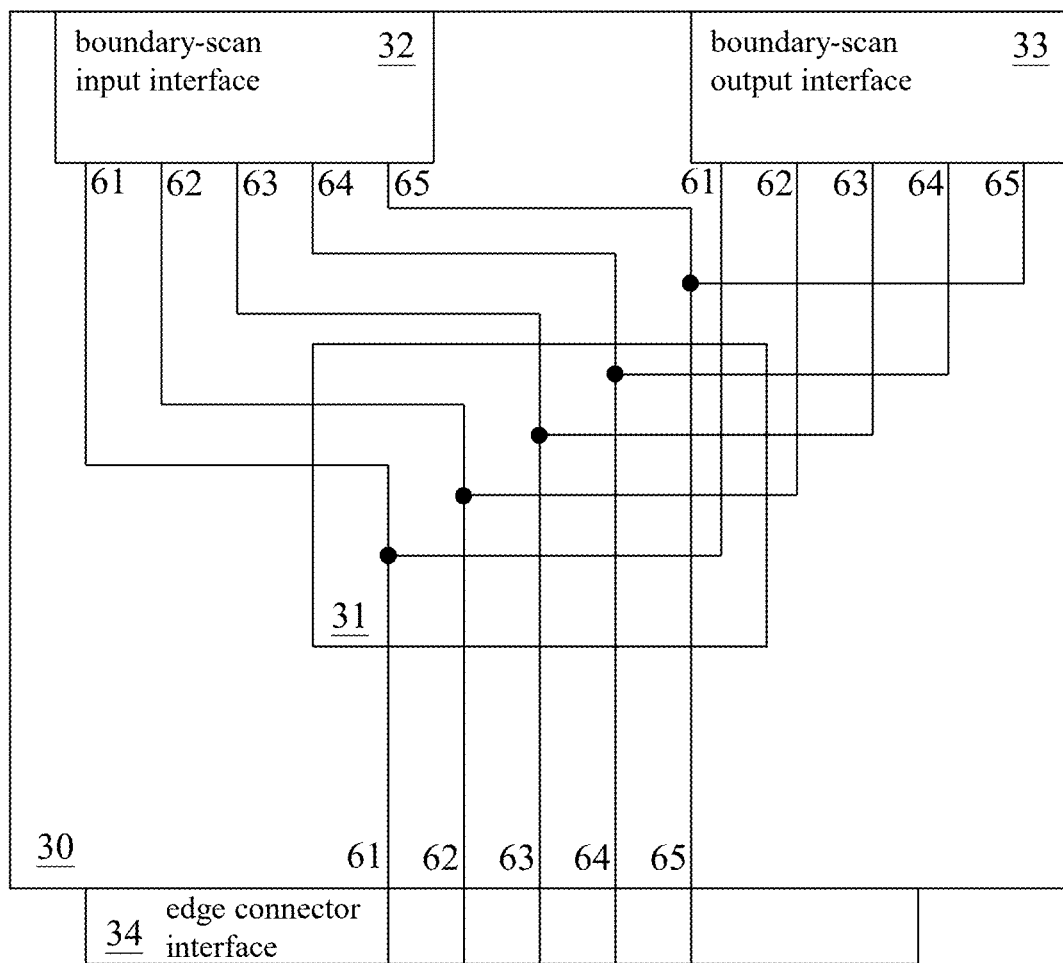
FIG. 6 is a block diagram of a test card of a boundary-scan standard pin test, according to a second embodiment of the present invention.

Please refer to FIG. 6. FIG. 6 is a block diagram of a test card of a boundary-scan standard pin test of a second embodiment, according to the present invention. Each of the test cards 30 includes a boundary scan component 31, a boundary-scan input interface 32, a boundary-scan output interface 33 and an edge connector interface 34. TDI pins 61 of the boundary scan component 31, the boundary-scan input interface 32, the boundary-scan output interface 33 and the edge connector interface 34 are electrically connected to each other, TDO pins 62 of the boundary scan component 31, the boundary-scan input interface 32, the boundary-scan output interface 33 and the edge connector interface 34 are electrically connected to each other. TCK pins 63 of the boundary scan component 31, the boundary-scan input interface 32, the boundary-scan output interface 33 and the edge connector interface 34 are electrically connected to each other, TMS pins 64 of the boundary scan component 31, the boundary-scan input interface 32, the boundary-scan output interface 33 and the edge connector interface 34 are electrically connected to each other, and TRST pin 65 of the boundary scan component 31, the boundary-scan input interface 32, the boundary-scan output interface 33 and the edge connector interface 34 are electrically connected to each other.

The edge connector interface 34 of each of the test cards is inserted into the riser card insertion interface 21 of a corresponding one of the riser cards 20, so that the edge connector interface 34 can be electrically connected to the TDI pin 61, the TDO pin 62, the TCK pin 63, the TMS pin 64, and the TRST pin 65 of the corresponding one of the riser card insertion interface 21. The test card 30 performs a boundary-scan standard pin test on a boundary-scan format test signal provided by the riser card 20 inserted thereto, and outputs a boundary-scan format test result signal.

As mentioned above, the first test card is inserted into the first riser card, the second test card is inserted into the second riser card, the third test card is inserted into the third riser card, the fourth test card is inserted into the fourth riser card, the edge connector interface of the first test card is electrically connected to the TDI pin, the TDO pin, the TCK pin, the TMS pin, and the TRST pin of the riser card insertion interface of the first riser card, respectively; the edge connector interface of the second test card is electrically connected to the TDI pin, the TDO pin, the TCK pin, the TMS pin, and the TRST pin of the riser card insertion interface of the second riser card, and so forth, so the detailed description of another connection is not repeated herein.

The test data generating device 50 is electrically connected to the TAP controller 40, and the test data generating device 50 provides the test data to the TAP controller 40. The TAP controller 40 is electrically connected to different riser-card series chains, respectively, and configured to convert different test data into the boundary-scan format test signals and provide one of the boundary-scan format test signals to the corresponding one of the riser-card series chains.

The test card 30 can perform the boundary-scan standard pin test on the boundary-scan format test signal provided from the riser card 20 inserted thereto, and output the boundary-scan format test result signal. The TAP controller 40 receives boundary-scan format test result signal from the riser-card series chain, and converts the received boundary-scan format test result signal into response data. The test data generating device 50 receives the response data corresponding to the to-be-tested slot from the TAP controller 40, so as to complete entire testing process.

Figure 7:
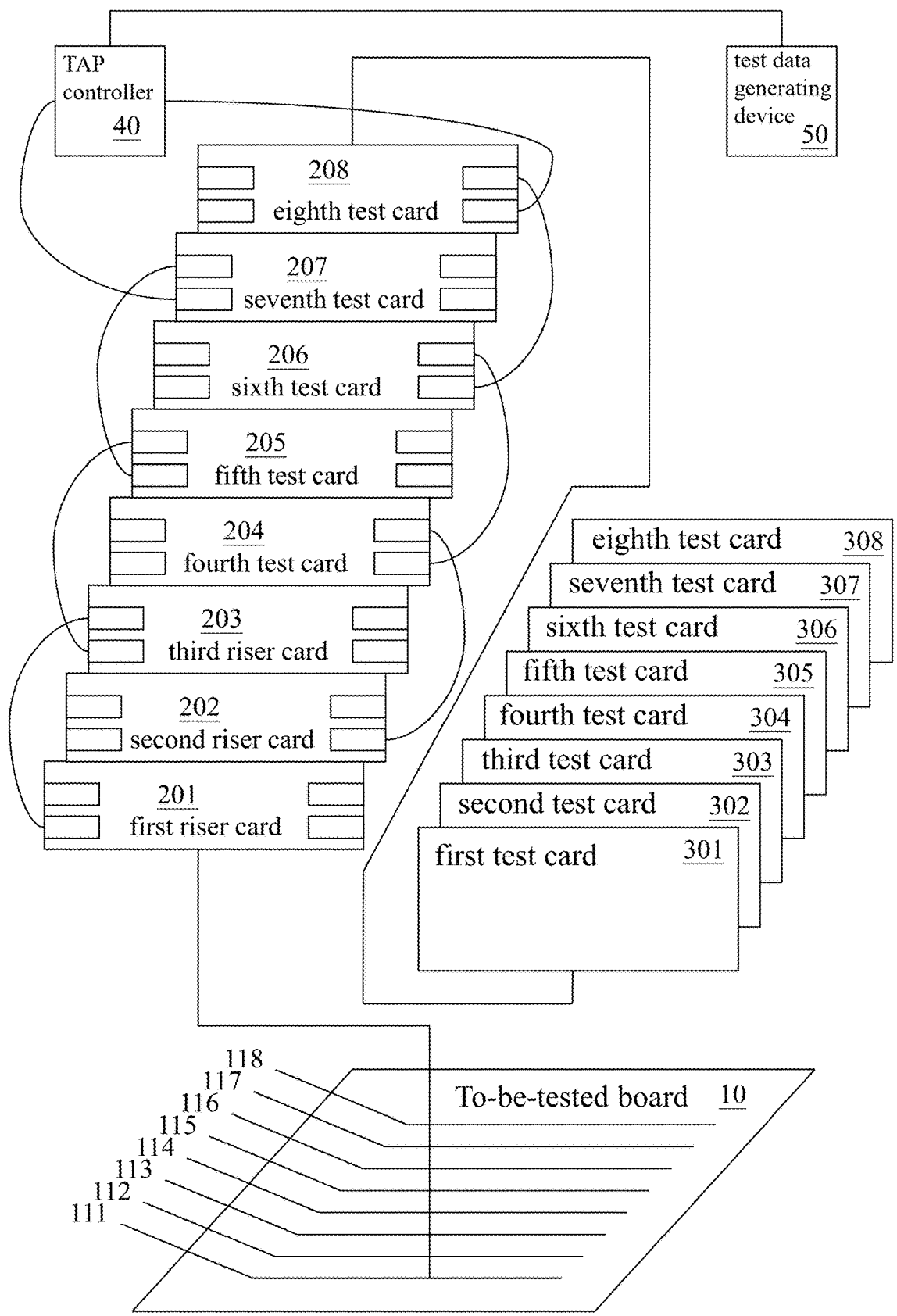
FIG. 7 is a structural view of a boundary-scan standard pin test, according to a second embodiment of the present invention.

Please refer to FIG. 7. FIG. 7 is a structural view of a second embodiment of a boundary-scan standard pin test, according to the present invention. The first boundary-scan output interface of the first riser card 201 is electrically connected to the first boundary-scan input interface of the third riser card 203, the first boundary-scan output interface of the third riser card 203 is electrically connected to the first boundary-scan input interface of the fifth riser card 205, and the first boundary-scan output interface of the fifth riser card 205 is electrically connected to the first boundary-scan input interface of the seventh riser card 207, so as to form a first riser-card series chain. The second boundary-scan output interface of the second riser card 202 is electrically connected to the second boundary-scan input interface of the fourth riser card 204, the second boundary-scan output interface of the fourth riser card 204 is electrically connected to the second boundary-scan input interface of the sixth riser card 204, and the second boundary-scan output interface of the sixth riser card 206 is electrically connected to the second boundary-scan input interface of the eighth riser card 208, so as to form a second riser-card series chain.

The first test card 301 is electrically connected to the first riser card 201, the second test card 302 is electrically connected to the second riser card 202, the third test card 303 is electrically connected to the third riser card 203, the fourth test card 304 is electrically connected to the fourth riser card 204, the fifth test card 305 is electrically connected to the fifth riser card 205, the sixth test card 306 is electrically connected to the sixth riser card 206, the seventh test card 307 is electrically connected to the seventh riser card 207, and the eighth test card 308 is electrically connected to the eighth riser card 208.

In actual test process, only the first riser card 201 is inserted into the first to-be-tested slot 111, the third riser card 203 is inserted into the third to-be-tested slot 113, the fifth riser card 205 is inserted into the fifth to-be-tested slot 115, and the seventh riser card 207 is inserted into the seventh to-be-tested slot 117.

The test data generating device 50 provides the test data corresponding to the first riser-card series chain to the TAP controller 40, the TAP controller 40 converts the test data into the boundary-scan format test signal corresponding to the first riser-card series chain, provides the boundary-scan format test signal to the first riser-card series chain. The first test card 201, the third test card 203, the fifth test card 205 and the seventh test card 207 perform the boundary-scan standard pin test and output the boundary-scan format test result signal.

In actual test process, only the second riser card 202, the fourth riser card 204, the sixth riser card 206 and the eighth riser card 208 are inserted into the second to-be-tested slot 112, the fourth to-be-tested slot 114, the sixth to-be-tested slot 116, and the eighth to-be-tested slot 118, respectively.

The test data generating device 50 provides the test data corresponding to the second riser-card series chain to the TAP controller 40, the TAP controller 40 converts the test data into the boundary-scan format test signal corresponding to the second riser-card series chain, provide the boundary-scan format test signal to the second riser-card series chain. The second test card 202, the fourth test card 204, the sixth test card 206 and the eighth test card 208 can perform boundary-scan standard pin test and output the boundary-scan format test result signal.

In actual test process, the first riser card 201 can be inserted into the first to-be-tested slot 111, the second riser card 202 can be inserted into the second to-be-tested slot 112, the third riser card 203 can be inserted into the third to-be-tested slot 113, the fourth riser card 204 can be inserted into the fourth to-be-tested slot 114, the fifth riser card 205 can be inserted into the fifth to-be-tested slot 115, the sixth riser card 206 can be inserted into the sixth to-be-tested slot 116, the seventh riser card 207 can be inserted into the seventh to-be-tested slot 117, and the eighth riser card 208 can be inserted into the eighth to-be-tested slot 118.

The test data generating device 50 can only provide the test data corresponding to the first riser-card series chain or the second riser-card series chain, to the TAP controller 40, the TAP controller 40 converts the test data into the boundary-scan format test signal corresponding to the first riser-card series chain or the second riser-card series chain, provide the boundary-scan format test signal to the first riser-card series chain or the second riser-card series chain, so that the first test card 201, the third test card 203, the fifth test card 205 and the seventh test card 207, or the second test card 202, the fourth test card 204, the sixth test card 206 and the eighth test card 208 can perform the boundary-scan standard pin test and output the boundary-scan format test result signal.

The test data generating device 50 can provide the test data corresponding to the first riser-card series chain and the second riser-card series chain to the TAP controller 40, the TAP controller 40 converts the test data into the boundary-scan format test signal corresponding to the first riser-card series chain and the second riser-card series chain, and provides the boundary-scan format test signal to the first riser-card series chain and the second riser-card series chain, so that the first test card 201, the second test card 202, the third test card 203, the fourth test card 204, the fifth test card 205, the sixth test card 206, the seventh test card 207 and the eighth test card 208 perform the boundary-scan standard pin test and output the boundary-scan format test result signal.

The above-mentioned test process is merely for exemplary illustration, the present invention is not limited to above-mentioned examples, and one of ordinary skill in the art can implement different combination of more riser-card series chain according to aforementioned test process, the detailed description is not repeated herein.

According to above-mentioned contents, the to-be-tested slots are electrically connected to form different to-be-tested series chains, or the riser cards are electrically connected to each other through the first boundary-scan input interfaces and the first boundary-scan output interfaces thereof or through the second boundary-scan input interfaces and the second boundary-scan output interfaces thereof, to form different riser-card series chains; the TAP controller provides the boundary-scan format test signal to the to-be-tested series chain or the riser-card series chain to make the test card perform the boundary-scan standard pin test.

Therefore, the above-mentioned technical solution of the present invention is able to solve the problem that the conventional testing machine is only able to perform the boundary-scan standard pin test on the to-be-tested slots of the same to-be-tested board, so as to achieve the technical effect of efficiency of providing the boundary-scan standard pin test for the to-be-tested slots on different to-be-tested boards by a testing machine.

The present invention disclosed herein has been described by means of specific embodiments. However, numerous modifications, variations and enhancements can be made thereto by those skilled in the art without departing from the spirit and scope of the disclosure set forth in the claims.

What is claimed is:

1. A boundary-scan standard pin test system, comprising:
    a to-be-tested board, having to-be-tested slots, wherein the to-be-tested slots are electrically connected to form different to-be-tested series chains;
    riser cards, wherein each of the riser cards has a riser card insertion interface, a riser-card edge-connector interface, a first boundary-scan input interface, a first boundary-scan output interface, a second boundary-scan input interface, and a second boundary-scan output interface, wherein test data input (TDI) pins of the riser card insertion interface, the riser-card edge-connector interface, the first boundary-scan input interface, the first boundary-scan output interface, the second boundary-scan input interface, and the second boundary-scan output interface are electrically connected to each other, test data output (TDO) pins of the riser card insertion interface, the riser-card edge-connector interface, the first boundary-scan input interface, the first boundary-scan output interface, the second boundary-scan input interface, and the second boundary-scan output interface are electrically connected to each other, test clock (TCK) pins of the riser card insertion interface, the riser-card edge-connector interface, the first boundary-scan input interface, the first boundary-scan output interface, the second boundary-scan input interface, and the second boundary-scan output interface are electrically connected to each other, test mode select (TMS) pins of the riser card insertion interface, the riser-card edge-connector interface, the first boundary-scan input interface, the first boundary-scan output interface, the second boundary-scan input interface, and the second boundary-scan output interface are electrically connected to each other, and test reset (TRST) pins of the riser card insertion interface, the riser-card edge-connector interface, the first boundary-scan input interface, the first boundary-scan output interface, the second boundary-scan input interface, and the second boundary-scan output interface are electrically connected to each other,
    wherein the riser-card edge-connector interface of each of the riser cards is inserted into a corresponding one of the to-be-tested slots, so that the inserted riser-card edge-connector interface is electrically connected to TDI pins, the TDO pins, the TCK pins, the TMS pins, and the TRST pins of the corresponding one of the to-be-tested slots;
    test cards, wherein each of the test cards has a boundary scan component, a boundary-scan input interface, a boundary-scan output interface, and an edge connector interface, wherein TDI pins of the boundary scan component, the boundary-scan input interface, the boundary-scan output interface, and the edge connector interface are electrically connected to each other, TDO pins of the boundary scan component, the boundary-scan input interface, the boundary-scan output interface, and the edge connector interface are electrically connected to each other, TCK pins of the boundary scan component, the boundary-scan input interface, the boundary-scan output interface, and the edge connector interface are electrically connected to each other, TMS pins of the boundary scan component, the boundary-scan input interface, the boundary-scan output interface, and the edge connector interface are electrically connected to each other, and TRST pins of the boundary scan component, the boundary-scan input interface, the boundary-scan output interface, and the edge connector interface are electrically connected to each other,
    wherein, the edge connector interface of each of the test cards is inserted into the riser card insertion interface of a corresponding one of the riser cards, so that the inserted edge connector interface is electrically connected to the TDI pins, the TDO pins, the TCK pins, the TMS pins, and the TRST pins of the riser card insertion interface of the corresponding one of the riser cards,
    wherein each of the test cards performs a boundary-scan standard pin test on a boundary-scan format test signal provided from the corresponding one of the to-be-tested slots and outputs a boundary-scan format test result signal;
    a test access port (TAP) controller, electrically connected to different to-be-tested series chains, and configured to convert test data into corresponding boundary-scan format test signals and provide the boundary-scan format test signals to the different to-be-tested series chains, respectively, receives the boundary-scan format test result signals from the to-be-tested series chains, and converts the received boundary-scan format test result signals into response data; and
    a test data generating device, electrically connected to the TAP controller, and configured to provide the test data to the TAP controller, and receive the response data corresponding to the to-be-tested slots from the TAP controller.

2. The boundary-scan standard pin test system according to claim 1, wherein the test data generating device provides the test data for single to-be-tested series chain to the TAP controller, and the TAP controller converts the test data into the boundary-scan format test signal and provide the boundary-scan format test signal to the single to-be-tested series chain.

3. The boundary-scan standard pin test system according to claim 1, wherein the riser cards and the test cards are correspondingly inserted with each other in the single to-be-tested series chain, the test data generating device provides the test data for the single to-be-tested series chain to the TAP controller, and the TAP controller converts the test data into the boundary-scan format test signal and provides the boundary-scan format test signal to the single to-be-tested series chain.

4. A boundary-scan standard pin test system comprising:
    a to-be-tested board, having to-be-tested slots;
    riser cards, wherein each of the riser cards comprises a riser card insertion interface, a riser-card edge-connector interface, a first boundary-scan input interface, a first boundary-scan output interface, a second boundary-scan input interface, and a second boundary-scan output interface, TDI pins of the riser card insertion interface, the riser-card edge-connector interface, the first boundary-scan input interface, the first boundary-scan output interface, the second boundary-scan input interface, and the second boundary-scan output interface are electrically connected to each other, TDO pins of the riser card insertion interface, the riser-card edge-connector interface, the first boundary-scan input interface, the first boundary-scan output interface, the second boundary-scan input interface, and the second boundary-scan output interface are electrically connected to each other, TCK pins of the riser card insertion interface, the riser-card edge-connector interface, the first boundary-scan input interface, the first boundary-scan output interface, the second boundary-scan input interface, and the second boundary-scan output interface are electrically connected to each other, TMS pins of the riser card insertion interface, the riser-card edge-connector interface, the first boundary-scan input interface, the first boundary-scan output interface, the second boundary-scan input interface, and the second boundary-scan output interface are electrically connected to each other, and TRST pins of the riser card insertion interface, the riser-card edge-connector interface, the first boundary-scan input interface, the first boundary-scan output interface, the second boundary-scan input interface, and the second boundary-scan output interface are electrically connected to each other, wherein the riser-card edge-connector interface of each of the riser cards is inserted into the riser card insertion interface of a corresponding one of the to-be-tested slots, so that the riser-card edge-connector interface of each of the riser cards is electrically connected to the TDI pins, the TDO pins, the TCK pins, the TMS pins, and the TRST pins of the riser card insertion interface of the corresponding one of the to-be-tested slots, test cards, wherein each of the test cards has a boundary scan component, a boundary-scan input interface, a boundary-scan output interface, and an edge connector interface, wherein TDI pins of the boundary scan component, the boundary-scan input interface, the boundary-scan output interface, and the edge connector interface are electrically connected to each other, TDO pins of the boundary scan component, the boundary-scan input interface, the boundary-scan output interface, and the edge connector interface are electrically connected to each other, TCK pins of the boundary scan component, the boundary-scan input interface, the boundary-scan output interface, and the edge connector interface are electrically connected to each other, TMS pins of the boundary scan component, the boundary-scan input interface, the boundary-scan output interface, and the edge connector interface are electrically connected to each other, and TRST pins of the boundary scan component, the boundary-scan input interface, the boundary-scan output interface, and the edge connector interface are electrically connected to each other, wherein the edge connector interface of each of the test cards is inserted into the riser card insertion interface of a corresponding one of the riser cards, so that the inserted edge connector interface is electrically connected to the TDI pins, the TDO pins, the TCK pins, the TMS pins, and the TRST pins of the riser card insertion interface of the corresponding one of the riser cards, wherein each of the test cards performs a boundary-scan standard pin test on a boundary-scan format test signal provided from the corresponding one of the to-be-tested slots and outputs a boundary-scan format test result signal;

a TAP controller, electrically connected to different riser-card series chains, and configured to convert test data into the boundary-scan format test signals and provide the boundary-scan format test signals to the riser-card series chains, receive the boundary-scan format test result signals from the riser-card series chains, convert the received boundary-scan format test result signals into response data; and a test data generating device, electrically connected to the TAP controller, configured to provide the test data to the TAP controller, and receive the response data corresponding to the to-be-tested slots from the TAP controller.

5. The boundary-scan standard pin test system according to claim 4, wherein the test data generating device provides the test data for single to-be-tested series chain to the TAP controller, and the TAP controller converts the test data into the boundary-scan format test signal and provide the boundary-scan format test signal to the single to-be-tested series chain.

6. The boundary-scan standard pin test system according to claim 4, wherein the riser cards and the test cards are correspondingly inserted with each other in the single to-be-tested series chain, the test data generating device provides the test data for the single to-be-tested series chain to the TAP controller, and the TAP controller converts the test data into the boundary-scan format test signal and provides the boundary-scan format test signal to the single to-be-tested series chain.

7. The boundary-scan standard pin test system according to claim 4, wherein the riser cards are electrically connected with each other solely through the first boundary-scan input interfaces and the first boundary-scan output interfaces thereof to form the different riser-card series chains.

8. The boundary-scan standard pin test system according to claim 4, wherein the riser cards are electrically connected to each other solely through the second boundary-scan input interfaces and the second boundary-scan output interfaces thereof to form different riser-card series chains.

9. The boundary-scan standard pin test system according to claim 4, wherein the riser cards are electrically connected to each other through the second boundary-scan input interfaces and the second boundary-scan output interfaces and the second boundary-scan input interfaces and the second boundary-scan output interfaces to form different riser-card series chains.

* * * * *